United States Patent
Schnetzka et al.

(10) Patent No.: US 10,148,206 B2
(45) Date of Patent: Dec. 4, 2018

(54) CONTROLLING OPERATION OF A POWER CONVERTER BASED ON GRID CONDITIONS

(71) Applicant: General Electric Company, Schenectady, NY (US)

(72) Inventors: Harold Robert Schnetzka, Simpsonville, SC (US); Allen Michael Ritter, Roanoke, VA (US); Robert Gregory Wagoner, Roanoke, VA (US); Daniel E. Jordy, Glenville, NY (US)

(73) Assignee: General Electric Company, Schenectady, NY (US)

( * ) Notice: Subject to any disclaimer, the term of this patent is extended or adjusted under 35 U.S.C. 154(b) by 66 days.

(21) Appl. No.: 15/193,302

(22) Filed: Jun. 27, 2016

(65) Prior Publication Data
US 2017/0373626 A1 Dec. 28, 2017

(51) Int. Cl.
| | | |
|---|---|---|
| *H02P 9/10* | (2006.01) | |
| *H02P 9/00* | (2006.01) | |
| *H02K 7/18* | (2006.01) | |
| *F03D 9/00* | (2016.01) | |
| *H02J 3/38* | (2006.01) | |

(Continued)

(52) U.S. Cl.
CPC ............. *H02P 9/102* (2013.01); *F03D 9/003* (2013.01); *H02J 3/386* (2013.01); *H02K 7/183* (2013.01); *H02P 9/006* (2013.01); *H02P 9/007* (2013.01); *H03K 17/166* (2013.01);
(Continued)

(58) Field of Classification Search
CPC .......... H02P 9/102; H02P 9/007; F03D 9/003; H02K 7/183
See application file for complete search history.

(56) References Cited

U.S. PATENT DOCUMENTS

| | | | | |
|---|---|---|---|---|
| 5,982,645 A | * | 11/1999 | Levran | ................ H01F 27/2866 307/66 |
| 8,513,911 B2 | * | 8/2013 | Jones | ..................... B63H 21/17 290/43 |

(Continued)

FOREIGN PATENT DOCUMENTS

| | | |
|---|---|---|
| WO | 2011/160643 A2 | 12/2011 |
| WO | WO2013/097856 A2 | 7/2013 |

(Continued)

OTHER PUBLICATIONS

"Application Considerations for Silicon Carbide MOSFETs," CREE, pp. 1-6 (2015).

(Continued)

*Primary Examiner* — Viet Nguyen
(74) *Attorney, Agent, or Firm* — Dority & Manning, PA (57) ABSTRACT

Systems and methods for controlling operation of a power converter based on grid conditions are provided. In particular, a first gating voltage can be applied to a switching element of a power converter associated with a wind-driven power generation system. The first gating voltage can be greater than a threshold voltage for the switching element. A grid event associated with an electrical grid coupled to the power generation system can be detected. A second gating voltage can be applied to the gate of the switching element during the detected grid event. The second gating voltage can be greater than the first gating voltage.

18 Claims, 3 Drawing Sheets

(51) Int. Cl.
*H03K 17/16* (2006.01)
*H02P 101/15* (2016.01)
*H02J 3/00* (2006.01)

(52) U.S. Cl.
CPC ...... *H03K 17/168* (2013.01); *H02J 2003/001* (2013.01); *H02P 2101/15* (2015.01); *H02P 2201/03* (2013.01)

(56) References Cited

U.S. PATENT DOCUMENTS

| | | | | |
|---|---|---|---|---|
| 8,614,568 | B2* | 12/2013 | Uruno | H02M 1/08 323/271 |
| 8,760,218 | B2 | 6/2014 | Zhu | |
| 9,748,947 | B1* | 8/2017 | Wagoner | H03K 17/567 |
| 2006/0267560 | A1* | 11/2006 | Rajda | G05F 1/70 323/209 |
| 2007/0052244 | A1* | 3/2007 | Hudson | F03D 7/0272 290/44 |
| 2007/0278797 | A1* | 12/2007 | Flannery | H02P 9/007 290/44 |
| 2009/0066402 | A1 | 3/2009 | Hiyama | |
| 2009/0079193 | A1* | 3/2009 | Nielsen | F03D 7/0272 290/44 |
| 2011/0007536 | A1 | 1/2011 | Takamatsu et al. | |
| 2011/0103110 | A1* | 5/2011 | Godridge | H02J 3/386 363/74 |
| 2012/0051101 | A1* | 3/2012 | El-Barbari | H02M 7/515 363/49 |
| 2012/0133342 | A1* | 5/2012 | Murata | H02P 3/18 322/21 |
| 2012/0212064 | A1 | 8/2012 | Spanoche et al. | |
| 2012/0215372 | A1 | 8/2012 | Kernahan et al. | |
| 2013/0119763 | A1* | 5/2013 | Zhu | H02M 1/36 307/43 |
| 2013/0162047 | A1* | 6/2013 | O'Brien | H02J 3/1807 307/82 |
| 2013/0249501 | A1* | 9/2013 | Lu | F03D 7/0224 322/21 |
| 2013/0293287 | A1 | 11/2013 | Zhu | |
| 2014/0126259 | A1* | 5/2014 | Inoue | H02M 1/32 363/98 |
| 2015/0084337 | A1* | 3/2015 | Wagoner | H02P 9/007 290/44 |
| 2015/0097598 | A1 | 4/2015 | Cronin | |
| 2015/0162905 | A1* | 6/2015 | Wagoner | H03K 17/0412 327/432 |
| 2015/0171770 | A1* | 6/2015 | Wagoner | H02M 1/08 363/132 |
| 2015/0295488 | A1 | 10/2015 | Shen et al. | |
| 2016/0036430 | A1* | 2/2016 | Rannestad | H03K 17/0822 363/132 |
| 2016/0182034 | A1* | 6/2016 | Wagoner | H03K 17/163 327/432 |

FOREIGN PATENT DOCUMENTS

| | | | |
|---|---|---|---|
| WO | WO 2014154221 A2 * | 10/2014 | ......... H05K 17/0822 |
| WO | WO2015/043602 A1 | 4/2015 | |
| WO | WO2015/162905 A1 | 10/2015 | |

OTHER PUBLICATIONS

"CAS300M17BM2 1.7kV, 8.0 mΩ All-Silicon Carbide Half-Bridge Module," CREE, pp. 1-9 (2014).

"Silicon carbide Power MOSFET: 45 A, 1200 V, 90 mΩ(typ., TJ=150° C.), N-channel in HiP247™," SCT30N120, pp. 1-13 (2015).

"SKM500MB120SC," SiC MOSFET Module, pp. 1-3 (2015).

"1700V SiC Power Module," GE Silicon Carbide half-bridge module offers superior performance for high power, high frequency applications, pp. 1-8 (2015).

Extended European Search Report and Opinion issued in connection with corresponding EP Application No. 17178136.2 dated Oct. 16, 2017.

* cited by examiner

CONTROLLING OPERATION OF A POWER CONVERTER BASED ON GRID CONDITIONS

FIELD OF THE INVENTION

The present subject matter relates generally power generation systems and more particularly to controlling operation of a power converter associated with a power generation system based at least in part on detected grid conditions.

BACKGROUND OF THE INVENTION

Generally, a wind turbine includes a turbine that has a rotor that includes a rotatable hub assembly having multiple blades. The blades transform wind energy into a mechanical rotational torque that drives one or more generators via the rotor. The generators are sometimes, but not always, rotationally coupled to the rotor through a gearbox. The gearbox steps up the inherently low rotational speed of the rotor for the generator to efficiently convert the rotational mechanical energy to electrical energy, which is fed into a utility grid via at least one electrical connection. Gearless direct drive wind turbines also exist. The rotor, generator, gearbox and other components are typically mounted within a housing, or nacelle, that is positioned on top of a base that may be a truss or tubular tower.

In order to supply power to the power grid, wind turbines need to conform to certain requirements. For example, wind turbines may need to offer fault ride through (e.g. low voltage ride through, zero voltage ride through) capability, which requires a wind turbine to stay connected to the power grid during one or more grid events corresponding to a change in the magnitude of grid voltage for a time duration. For example, when a grid event occurs, voltage in the system can decrease by a significant amount for a short duration (e.g. typically less than 500 milliseconds).

In the past, during such grid events, it has been acceptable for a wind turbine to be immediately disconnected whenever the voltage reduction occurs. However, as wind turbines continue to increase in size and penetration of wind turbines on the grid increases, it is desirable for the wind turbines to remain on line and ride through such disturbances.

Conventional wind turbine systems may include one or more power converters configured to convert an alternating current power to a direct current power, or vice-versa. Such power converters may include semiconductor devices such as IGBTs or MOSFETs that can be used as electronic switching elements for a variety of applications. For instance, IGBTs can be used in bridge circuits of a power converter. Often a freewheeling diode is coupled in parallel with the IGBT to control current flow in, for instance, a bridge circuit.

IGBTs typically include three terminals, including a gate, a collector, and an emitter. The IGBT can be operated as a switching element by controlling the gate-emitter voltage using a gate drive circuit. For instance, when the gate-emitter voltage exceeds a threshold voltage for the IGBT, the IGBT can be turned on such that current can flow through the collector and emitter of the IGBT. When the gate-emitter voltage is less than the threshold voltage for the IGBT, the IGBT can be turned off such that current flow through the collector and emitter is limited.

BRIEF DESCRIPTION OF THE INVENTION

Aspects and advantages of embodiments of the present disclosure will be set forth in part in the following description, or may be learned from the description, or may be learned through practice of the embodiments.

One example aspect of the present disclosure is directed to a method of gating a switching element used in a power converter of a wind-driven power generation system. The method includes applying a first gating voltage to a switching element to turn the switching element on. The switching element is associated with a power converter of a wind-driven power generation system. The first gating voltage is greater than a threshold voltage for the switching element. The method further includes detecting a grid event associated with an electrical grid coupled to the wind-driven power generation system. The method further includes applying a second gating voltage to the gate of the switching element during the detected grid event. The second gating voltage is greater than the first gating voltage.

Another example aspect of the present disclosure is directed to a gate drive circuit for applying a gate voltage to a gate of a switching element. The gate drive circuit includes an active gate control circuit configured to apply a first gating voltage to a switching element to turn the switching element on. The first gating voltage is greater than a threshold voltage for the switching element. The active gate control circuit is further configured to detect a grid event associated with an electrical grid associated with the gate drive circuit. The active gate control circuit is further configured to apply a second gating voltage to the gate of the switching element during the detected grid event. The second gating voltage is greater than the first gating voltage.

Yet another example aspect of the present disclosure is directed to a bridge circuit used in a power converter of a power system. The bridge circuit includes a first transistor having a gate, a second transistor coupled in series with the first transistor, a diode coupled in parallel with the first transistor, a gate drive circuit configured to apply a voltage to the gate of the first transistor. The gate drive circuit includes a gate resistor and an active gate control circuit. The gate drive circuit is configured to apply a first gating voltage via the gate resistor to the gate of the transistor to turn on the first transistor. The first gating voltage is greater than a threshold voltage for the first transistor. The active gate control circuit is further configured to detect a ride through grid event associated with an electrical grid coupled to the power system. The active gate control circuit is further configured to, responsive to detecting the grid event, apply a second gating voltage via the gate resistor to the gate of the first transistor during the grid event. The second gating voltage is greater than the first gating voltage.

Variations and modifications can be made to these example aspects of the present disclosure.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Example aspects of the present disclosure are directed to controlling operation of a wind-driven power generation system (e.g. a wind turbine system) based at least in part on grid conditions associated with an electrical grid coupled to the system. For instance, during operation of a wind turbine system, one or more switching elements associated with a power converter of the wind turbine system can be controlled using a first on voltage. The first on voltage can be a voltage suitable to turn the switching element on (e.g. to operate the switching element in a conduction mode). A grid event, such as a low voltage ride through or a zero voltage ride through event, associated with the wind turbine system can be detected. In response to detecting the grid event, the one or more switching elements can be controlled using a second on voltage. The second on voltage can be greater than the first on voltage. In particular, the second on voltage can be determined to increase the current conduction capability of the one or more switching elements.

More particularly, a wind turbine system may include one or more power converters configured to convert alternating current (AC) power to direct current (DC) power, and vice versa. The power converter(s) may include one or more bridge circuits that include one or more switching elements. In various implementations, the switching elements can include insulated-gate bipolar transistors (IGBTs), silicon carbide metal-oxide-semiconductor field-effect transistors (MOSFETs), or other suitable switching element. Operation of the power converter and/or the switching elements can be controlled, for instance, in accordance with one or more pulse width modulation (PWM) control schemes to convert an alternating current (AC) power to a direct current power, or vice versa. For instance, the switching elements can be switched on and off by applying one or more voltage signals to the respective gates the switching elements. In particular, a gate driver circuit can be configured to provide a first on voltage to a corresponding switching element to turn the switching element on. The first on voltage can be greater than a threshold voltage of the switching element. For instance, in implementations wherein the switching element is an IGBT, the first on voltage can be a voltage of about 15 volts. As another example, in implementations wherein the switching element is a silicon carbide MOSFET, the first on voltage can be a voltage of about 20 volts. As used herein, the term "about," when used in conjunction with a numerical value, is intended to refer to within 40% of the numerical value.

Those skilled in the art will appreciate that the switching element control scheme can further include one or more "off" voltages configured to turn the switching element off during one or more time periods. The off voltage can be sufficiently less than the threshold voltage of the switching element such that, when applied to the switching element, the switching element is fully off. For instance, in some implementations, the off voltage can be a voltage in the range of about −2 volts to about −7 volts. It will be appreciated that other suitable off voltages can be used.

As indicated, when a grid event associated with a drop in voltage at the grid, such as a low voltage ride through (LVRT) event or a zero voltage ride through (ZVRT) event is detected, the gate driver circuit can be configured to provide a second on voltage to the switching element. The second on voltage can be greater than the first on voltage. For instance, in implementations wherein the switching element is an IGBT, the second on voltage can be a voltage of about 20 volts. As another example, in implementations wherein the switching element is a silicon carbide MOSFET, the second on voltage can be a voltage of about 24 volts. It will be appreciated that other suitable voltages can be used.

In some implementations, the grid event can be detected based at least in part on data provided by one or more sensors associated with the wind turbine system. The sensors can be configured to monitor various parameters associated with the wind turbine system and/or the electrical grid, such as rotor speed, generator output voltage, rotor current, and/or other suitable parameter. In some implementations, the sensors can be configured to provide data indicative of such monitored parameters to a controller associated with the wind turbine system and/or the power converter(s).

In some implementations, the second on voltage can be provided to the switching element based at least in part on a rotor current associated with the wind turbine system. In particular, the rotor current can be monitored by one or more sensors, and compared to a rotor current threshold. When the rotor current is less than the threshold, the first on voltage can be used to control the switching element. When the rotor current is greater than the threshold, the second on voltage can be used to control the switching element. In some implementations, detection of a grid event associated with a voltage drop at the grid can trigger the comparison process. For instance, the rotor current can be monitored and/or compared to the threshold in response to detection of the grid event.

Using the second on voltage to control operation of the switching elements of the power converter(s) can allow the wind turbine system to remain coupled to the electrical grid during a detected grid event. Such a grid event can cause an increase in rotor current provided to the power converter, which may cause damage to the switching elements of the power converter during normal operation. Applying an increased on voltage to the switching elements can allow the switching elements to conduct a greater amount of current through the terminals of the switching element. In this manner, during at least a portion of the detected grid event, operation of the switching elements can be controlled using the second on voltage.

Figure 1:
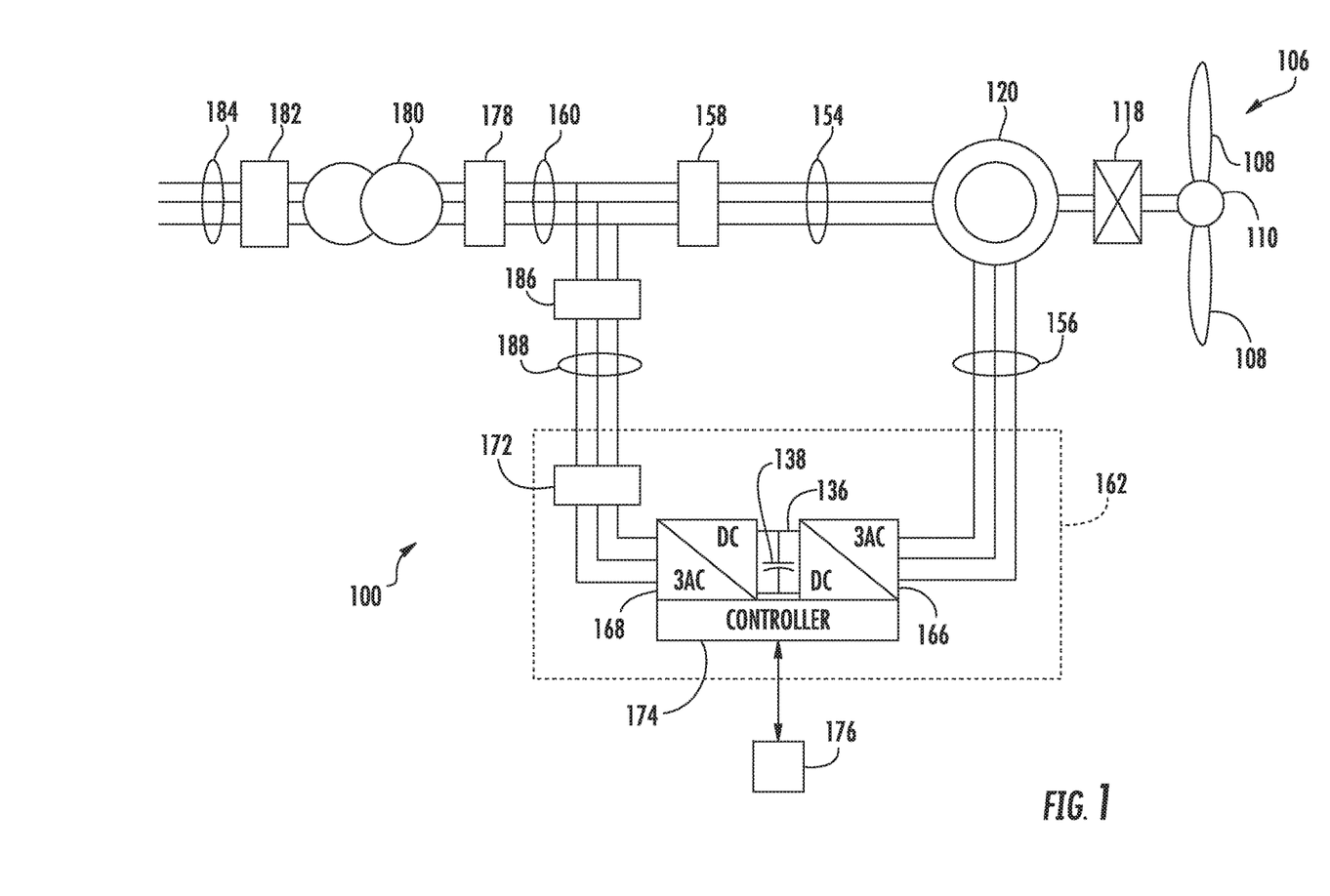
FIG. 1 depicts an overview of an example wind-driven power generation system according to example embodiments of the present disclosure.

With reference now to the figures, example aspects of the present disclosure will be discussed in greater detail. For instance, FIG. 1 depicts an example doubly fed induction generator (DFIG) wind turbine system 100 according to example embodiments of the present disclosure. The present disclosure will be discussed with reference to the example DFIG wind turbine system 100 of FIG. 1 for purposes of illustration and discussion. Those of ordinary skill in the art, using the disclosures provided herein, should understand that aspects of the present disclosure are also applicable in other power generation systems.

In the example system 100, a rotor 106 includes a plurality of rotor blades 108 coupled to a rotating hub 110, and together define a propeller. The propeller is coupled to an optional gear box 118, which is, in turn, coupled to a generator 120. In accordance with aspects of the present disclosure, the generator 120 is a doubly fed induction generator (DFIG) 120.

DFIG 120 is typically coupled to a stator bus 154 and a power converter 162 via a rotor bus 156. The stator bus 154 provides an output multiphase power (e.g. three-phase power) from a stator of DFIG 120 and the rotor bus 156 provides an output multiphase power (e.g. three-phase power) of a rotor of the DFIG 120. DFIG 120 is coupled via the rotor bus 156 to a power converter 162. In particular, DIFG 120 is coupled to a rotor side converter 166 of power converter 162. The rotor side converter 166 is coupled to a line side converter 168 which in turn is coupled to a line side bus 188.

In example implementations, the rotor side converter 166 and the line side converter 168 are configured for normal operating mode in a three-phase, pulse width modulation (PWM) arrangement using IGBT and/or MOSFET switching elements. The rotor side converter 166 and the line side converter 168 can be coupled via a DC link 136 across which is the DC link capacitor 138.

The power converter 162 can be coupled to a controller 174 to control the operation of the rotor side converter 166 and the line side converter 168. It should be noted that the controller 174, in typical embodiments, is configured as an interface between the power converter 162 and a control system 176. The controller 174 can include any number of control devices. In one implementation, the controller 174 can include a processing device (e.g. microprocessor, microcontroller, etc.) executing computer-readable instructions stored in a computer-readable medium.

More particularly, controller 174 can include one or more processor(s) and associated memory device(s) configured to perform a variety of computer-implemented functions and/or instructions (e.g., performing the methods, steps, calculations and the like and storing relevant data as disclosed herein). The instructions when executed by the processor can cause the processor to perform operations, including providing control commands to the various system components. For instance, the control commands can include pulse width modulation commands provided to the switching elements of the power converter 162. Additionally, the controller 174 may include a communications module to facilitate communications between the controller 174 and the various components of the system 100, such as for instance, any of the components of FIG. 1. Further, the communications module may include a sensor interface (e.g., one or more analog-to-digital converters) to permit signals transmitted from one or more sensors to be converted into signals that can be understood and processed by the processors. It should be appreciated that the sensors may be communicatively coupled to the communications module using any suitable means, such as via a wired or wireless connection. As such, the processor may be configured to receive one or more signals from the sensors.

As used herein, the term "processor" refers not only to integrated circuits referred to in the art as being included in a computer, but also refers to a controller, a microcontroller, a microcomputer, a programmable logic controller (PLC), an application specific integrated circuit, and other programmable circuits. The processor is also configured to compute advanced control algorithms and communicate to a variety of Ethernet or serial-based protocols (Modbus, OPC, CAN, etc.). Additionally, the memory device(s) may generally comprise memory element(s) including, but not limited to, computer readable medium (e.g., random access memory (RAM)), computer readable non-volatile medium (e.g., a flash memory), a floppy disk, a compact disc-read only memory (CD-ROM), a magneto-optical disk (MOD), a digital versatile disc (DVD) and/or other suitable memory elements. Such memory device(s) may generally be configured to store suitable computer-readable instructions that, when implemented by the processor(s), configure the processor(s) to perform the various functions as described herein.

In typical configurations, various line contactors and circuit breakers including, for example, grid breaker 182 can be included in system 100 for isolating the various components as necessary for normal operation of DFIG 120 during connection to and disconnection from the electrical grid 184. A system circuit breaker 178 can couple the system bus 160 to a transformer 180, which is coupled to the electrical grid 184 via grid breaker 182.

In operation, alternating current power generated at DFIG 120 by rotating the rotor 106 is provided via a dual path to electrical grid 184. The dual paths are defined by the stator bus 154 and the rotor bus 156. On the rotor bus side 156, sinusoidal multi-phase (e.g. three-phase) alternating current (AC) power is provided to the power converter 162. The rotor side power converter 166 converts the AC power provided from the rotor bus 156 into direct current (DC) power and provides the DC power to the DC link 136. Switching elements (e.g. IGBTs, silicon carbide MOSFETs, etc.) used in bridge circuits of the rotor side power converter 166 can be modulated to convert the AC power provided from the rotor bus 156 into DC power suitable for the DC link 136.

The line side converter 168 converts the DC power on the DC link 136 into AC output power suitable for the electrical grid 184. In particular, switching elements (e.g. IGBTs, silicon carbide MOSFETs, etc.) used in bridge circuits of the line side power converter 168 can be modulated to convert the DC power on the DC link 136 into AC power on the line side bus 188. The AC power from the power converter 162 can be combined with the power from the stator of DFIG 120 to provide multi-phase power (e.g. three-phase power) having a frequency maintained substantially at the frequency of the electrical grid 184 (e.g. 50 Hz/60 Hz).

As indicated, the rotor converter 166 and the line side converter 168 can each include a plurality of bridge circuits. Each bridge circuit can include a plurality of switching elements (e.g. IGBTs, MOSFETs, etc.) coupled in series with one another. For instance, each bridge circuit can include an upper switching element and a lower switching element. In some implementations, diode can be coupled in parallel with each of the switching elements. The line side converter 168 and the rotor side converter 166 are controlled, for instance, by providing control commands, using a suitable driver circuit, to the gates of the IGBTs. For example, the controller 174 can provide suitable gate timing commands to the gates of the IGBTs of the bridge circuits. The control commands can control the pulse width modulation of the IGBTs to provide a desired output.

Various circuit breakers and switches, such as grid breaker 182, system breaker 178, stator sync switch 158, converter breaker 186, and line contactor 172 can be included in the system 100 to connect or disconnect corresponding buses, for example, when current flow is excessive and can damage components of the wind turbine system 100 or for other operational considerations. Additional protection components can also be included in the wind turbine system 100.

As indicated, the power converter 162 can receive control signals from, for instance, the control system 176 via the controller 174. The control signals can be based, among other things, on sensed conditions or operating characteristics of the wind turbine system 100. Typically, the control signals provide for control of the operation of the power converter 162. For example, feedback in the form of sensed speed of the DFIG 120 can be used to control the conversion of the output power from the rotor bus 156 to maintain a proper and balanced multi-phase (e.g. three-phase) power supply. Other feedback from other sensors can also be used by the controller 174 to control the power converter 162, including, for example, stator and rotor bus voltages and current feedbacks. Using the various forms of feedback information, switching control signals (e.g. gate timing commands for IGBTs), stator synchronizing control signals, and circuit breaker signals can be generated.

Figure 2:
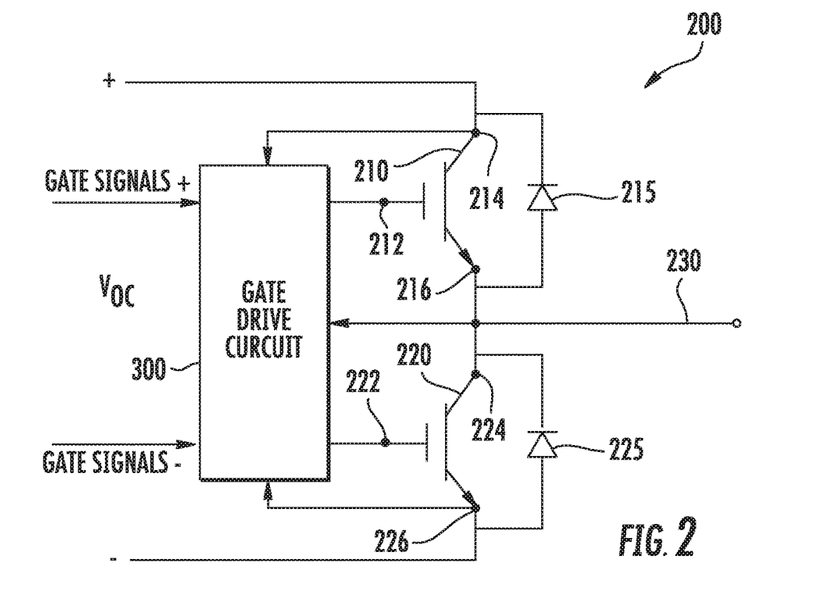
FIGS. 2-3 depict example bridge circuits used in a power converter of a power system according to example embodiments of the present disclosure.

FIG. 2 depicts an example bridge circuit 200 that can be used, for instance, in power converter 162 (e.g. in rotor converter 166 and/or line side converter 168), or other power converter. The bridge circuit 200 includes a first IGBT 210 (e.g. an "upper" IGBT) and a second IGBT 220 (e.g. a "lower" IGBT). The first IGBT 210 can include a gate 212, a collector 214, and an emitter 216. Similarly, the second IGBT 220 can include a gate 222, a collector 224, and an emitter 226. It will be appreciated that bridge circuit 200 may include various other suitable switching elements, such as silicon carbide MOSFETs, or other suitable switching elements. A first freewheeling diode 215 can be coupled in parallel with the first IGBT 210. A second freewheeling diode 225 can be coupled in parallel with the second IGBT 220.

The bridge circuit can include a gate drive circuit 300. The gate drive circuit 300 can control the gate-emitter voltages of the respective gates of the first IGBT 210 and the second IGBT 220 to control the switching of the first IGBT 210 and the second IGBT 220. For instance, the gate drive circuit 300 can provide pulse width modulation (PWM) commands to the first IGBT 210 and the second IGBT 220 to convert an alternating current power at the input 230 of the bridge circuit 200 to a direct current power or vice versa.

Figure 3:
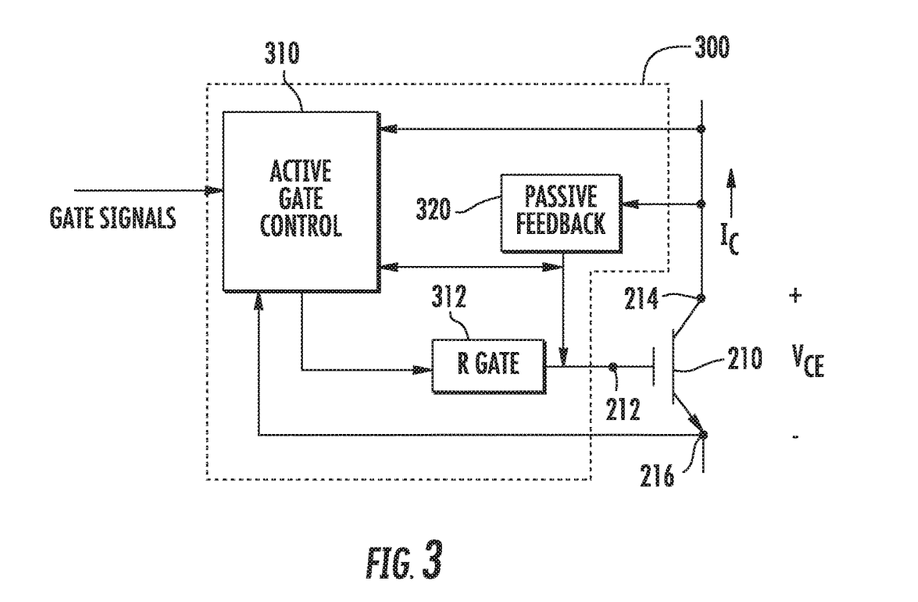

FIG. 3 depicts an example gate drive circuit 300 according to an example embodiment of the present disclosure. The gate drive circuit 300 will be discussed with reference to controlling a gate-emitter voltage of the first IGBT 210. The gate drive circuit 300 can be configured to control the gate-emitter voltage of additional IGBTs, such as the second IGBT 220 shown in FIG. 2.

Referring back to FIG. 3, the gate drive circuit 300 includes an active gate control circuit 310. The active gate control circuit 310 can be configured to apply voltages, via a gate resistor 312, to the gate 212 of the IGBT 210 to control operation of the IGBT. The active gate control circuit 310 can include one or more control devices or circuits, such as one or more controllers, microprocessors, logic devices, memory units, microcontrollers, or other control devices. The active gate control circuit 310 can receive commands (e.g. PWM commands) from other system controllers, such as controller 174 or other controller.

In one example implementation, the active gate control circuit 310 can include one or more processors and one or more computer-readable media. The one or more processors can be configured to execute computer-readable instructions stored in the one or more computer-readable media to cause the active gate control circuit 310 to perform operations, such as applying a voltage to the gate 212 of the IGBT 210 in accordance with example aspects of the present disclosure.

The active gate control circuit 310 can receive feedback elements from the IGBT 210. For instance, as shown the active gate control circuit 310 can receive feedback of the collector current $I_C$ as well as the collector-emitter voltage $V_{CE}$ and gate-emitter voltage $V_{GE}$. Other active feedback elements can be included without deviating from the scope of the present disclosure.

In example embodiments, the gate drive circuit 300 can further include a passive feedback network 320. The passive feedback network 320 can include a passive feedback element coupled between the collector 214 of the IGBT 210 and the gate 212 of the IGBT 210. The passive feedback element can be, for instance, a capacitor. The passive feedback network 320 may be included to provide a high bandwidth feedback loop for control stability.

According to particular aspects of the present disclosure, the active gate control circuit can provide two different on voltage levels via the gate resistor 312 to the gate 212 of the IGBT 210. For instance, the two different on voltage levels can be used to turn the IGBT on as part of a PWM control scheme to convert an alternating current (AC) power to a direct current power, or vice versa. In particular, determination of when to provide a first on voltage and a second on voltage (e.g. corresponding to the two different on voltage levels) can be made based at least in part on grid conditions associated with an electrical grid, such as electrical grid 184 of FIG. 1.

For instance, as indicated, a grid event associated with a dip in voltage at electrical grid 184 can be detected. In particular, the grid event can be a low voltage ride through event or a zero voltage ride through event. In some implementations, the grid event can be detected based at least in part on data received from various sensors associated with system 100, and/or from the active and/or passive feedback associated with active gate control circuit 310.

The first voltage signal can be used as part of the control scheme to control the IGBT 210 during normal operation of system 100 (e.g. during "normal" grid conditions, wherein a grid event has not been detected). As indicated above, the first voltage signal can be a voltage signal sufficiently greater than the threshold voltage of the IGBT 210, such that the IGBT 210 fully turns on when the first voltage signal is provided to the gate 212 of the IGBT 210 via the gate resistor 312. For instance, the first voltage signal can be a voltage in a range of about 15 volts to about 20 volts.

Upon detection of a grid event, the system 100 can enter a "ride-through" operating mode, wherein the second voltage signal is used to control the IGBT 210. The second voltage signal can be of a greater magnitude than the first voltage signal. For instance, the second voltage signal can be a voltage of about 20 volts to about 24 volts. In this manner, providing the second voltage signal to the IGBT 210 can allow the IGBT 210 to conduct a greater amount of current than when the first voltage signal is provided to the IGBT 210.

In some implementations, the second voltage signal can be provided to the IGBT 210 based at least in part on current being provided to the power converter 162 by the rotor 106 of system 100. In particular, the rotor current can be measured and compared to a rotor current threshold. If the rotor current exceeds the threshold, the second voltage signal can be provided to the IGBT 210. If the rotor current does not exceed the threshold, the first voltage signal can be provided to the IGBT 210. As indicated above, in some implementations, the second voltage signal can be provided to the IGBT 210 when a grid event is detected and when the rotor current exceeds the threshold. In this manner, the comparison process associated with the rotor current can be triggered by the detection of a grid event.

Figure 4:
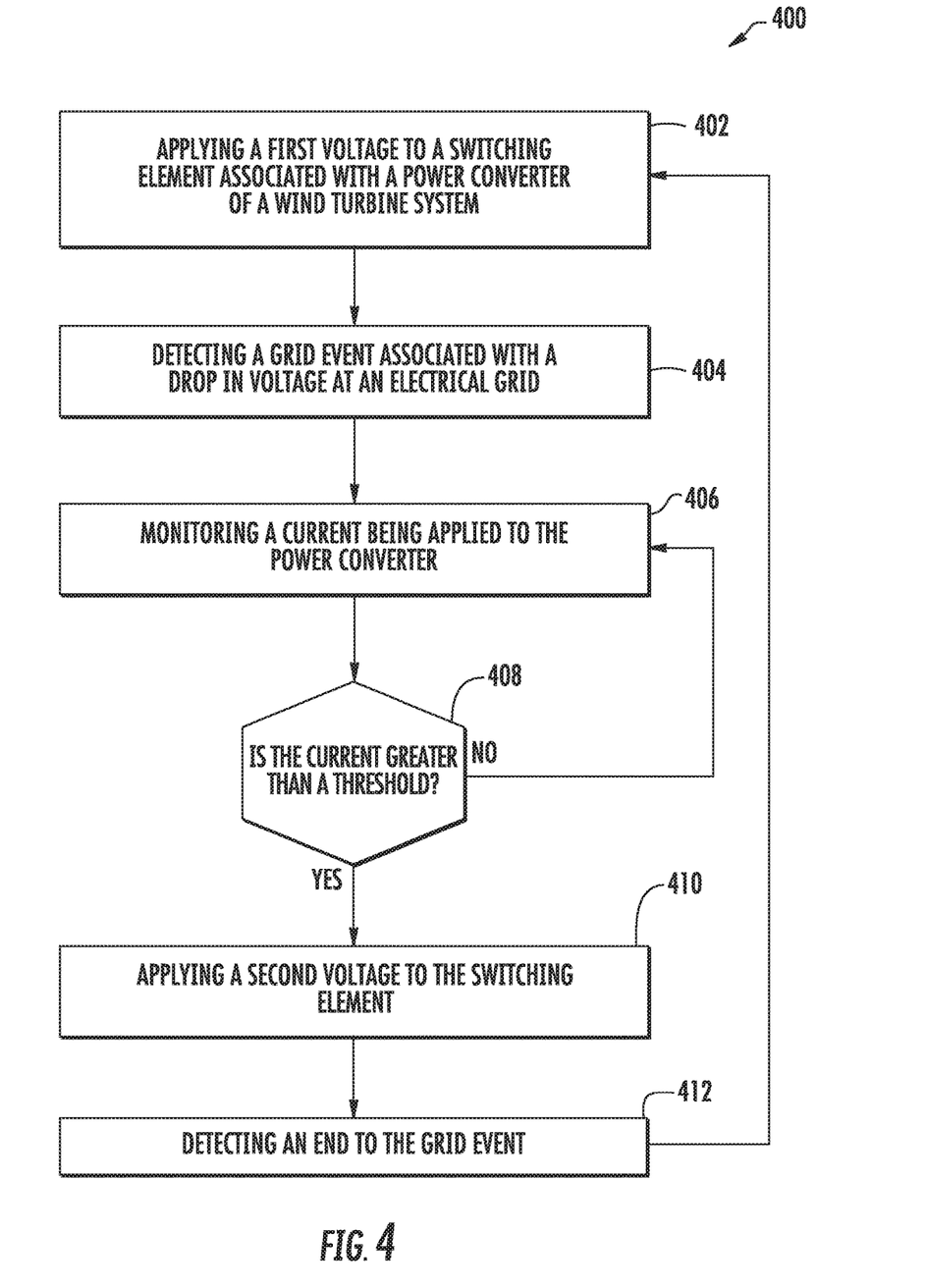
FIG. 4 depicts a flow diagram of an example method of gating a switching element in a power converter according to example embodiments of the present disclosure.

FIG. 4 depicts a flow diagram of an example method (400) of controlling operation of a power converter associated with a wind-driven power generation system. Method (400) can be implemented by one or more computing devices, such as controller 174 and/or active gate control circuit 310 of FIGS. 1 and 3. In addition, FIG. 4 depicts steps performed in a particular order for purposes of illustration and discussion. Those of ordinary skill in the art, using the disclosures provided herein, will understand that the steps of any of the methods discussed herein can be adapted, rearranged, expanded, omitted, or modified in various ways without deviating from the scope of the present disclosure.

A (402), method (400) can include applying a first voltage to a switching element associated with a power converter of a power generation system, such as a wind turbine system. In some implementations, the wind turbine system can be a doubly fed induction generator system. The first voltage can be of a sufficient magnitude to turn the switching element on. In particular, the first voltage can be sufficiently greater than a threshold voltage of the switching element so that, when applied, the switching element is fully on. The voltage can be applied based at least in part on a signal received from a suitable control system, such as for instance, a PWM command used to control the switching of the switching element. In this manner, the first voltage can be a voltage used to turn the switching element on within a PWM control scheme. The switching element may be turned off using any suitable "off" voltage, such as a voltage within about −2 volts to about −7 volts.

At (404), method (400) can include detecting a grid event associated with a drop in voltage at an electrical grid coupled to the power generation system. For instance, the grid event can be a fault ride through event, such as a low voltage ride through event or a zero voltage ride through event. For instance, the grid event can occur when the voltage at the electrical grid falls below a threshold voltage. As indicated above, the grid event can be detected by monitoring (e.g. with one or more sensors) a number of parameters and/or characteristics associated with the power generation system and/or the electrical grid.

At (406), method (400) can include monitoring a current being applied to the power converter from a rotor of the power generation system. In some implementations, the rotor current can be monitored or otherwise measured in response to detection of a grid event.

At (408), method (400) can include comparing the rotor current to a rotor current threshold. As indicated above, a grid event, such as a low voltage ride through event or a zero voltage ride through event, can cause an increased rotor current, which can cause damage to the switching elements of the power converter if preventative action is not taken. In this manner, the rotor current threshold can be a current level wherein such damage can occur. For instance, the threshold can be a current level some percentage above the maximum steady state current rating of the switching element. In some implementations, the comparison of the rotor current to the threshold can be performed in response to detection of the grid event.

If the rotor current is not greater than the current threshold, method (400) can return to (406). If the rotor current is greater than the current threshold, method (400) can include applying a second voltage to the switching element (410). The second voltage can be greater than the first voltage. In some implementations, the magnitude of the second voltage can be determined based at least in part on the switching element, so as to remain within the capabilities of the switching element. In some implementations, the magnitude of the second voltage can be determined based at least in part on the increased rotor current, such that, when the second voltage is applied to the switching element, the switching element is able to conduct an amount of current greater than or equal to the increased rotor current.

At (412), method (400) can include detecting an end to the grid event. Upon detection of the end of the grid event, method (400) can return to (402).

It will be appreciated that method (400) can be applied to one or more switching elements associated with one or more power converters of the power generation system. For instance, method (400) can be applied to one or more switching elements associated with a rotor and/or line side power converter of a wind turbine system.

Although specific features of various embodiments may be shown in some drawings and not in others, this is for convenience only. In accordance with the principles of the present disclosure, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method of gating a switching element used in a power converter of a wind-driven power generation system, wherein the switching element has a current conduction capability, the method comprising:
applying a first gating voltage to a switching element to turn the switching element on, the switching element being associated with a power converter of a wind-driven power generation system and said switching element being used to convert a first AC power signal provided from a rotor bus into a DC power suitable for a DC link or used to convert the DC power on the DC link to a second AC power signal provided to a line side bus, the first gating voltage being greater than a threshold voltage for the switching element;
detecting a grid event associated with an electrical grid coupled to the wind-driven power generation system, wherein said grid event causes an increase in a current provided to the power converter;
comparing the current provided to the power converter to a predetermined threshold;
determining whether the current provided to the power converter exceeds the threshold; and in response to determining that the current provided to the power converter exceeds the threshold, applying a second gating voltage to the gate of the switching element during the detected grid event such that the current conduction capability of the switching element is increased, the second gating voltage being greater than the first gating voltage.

2. The method of claim 1, wherein the magnitude of the second gating voltage is determined based at least in part on a rotor current.

3. The method of claim 1, further comprising, subsequent to the grid event, applying the first gating voltage to the gate of the switching element.

4. The method of claim 1, wherein the grid event is a low voltage ride through grid event or a zero voltage ride through grid event.

5. The method of claim 1, wherein the switching element is an insulated-gate bipolar transistor.

6. The method of claim 1, wherein the switching element is a silicon carbide metal-oxide-semiconductor field-effect transistor.

7. The method of claim 1, wherein the first gating voltage and the second gating voltage are determined based at least in part on the switching element.

8. The method of claim 1, wherein the first and second gating voltages are applied to the switching element in accordance with a pulse width modulation control scheme to convert a first type of power to a second type of power.

9. The method of claim 8, further comprising applying an off voltage to the switching element, the off voltage being less than the threshold voltage.

10. A gate drive circuit for applying a gate voltage to a gate of a switching element, wherein the switching element has a current conduction capability, the gate drive circuit comprising:
an active gate control circuit, the active gate control circuit configured to:
apply a first gating voltage to a switching element to turn the switching element on, said switching element being used to convert a first AC power signal provided from a rotor bus into a DC power suitable for a DC link or used to convert the DC power on the DC link to a second AC power signal provided to a line side bus, the first gating voltage being greater than a threshold voltage for the switching element;
detect a grid event associated with an electrical grid coupled to the wind-driven power generation system, wherein said grid event causes an increase in a current provided to the gate drive circuit; and
apply a second gating voltage to the gate of the switching element during the detected grid event such that the current conduction capability of the switching element is increased, the second gating voltage being greater than the first gating voltage.

11. The gate drive circuit of claim 10, further comprising a gate resistor coupled to the active gate control circuit; and
wherein the first and second gating voltages are applied to the gate of the switching element via the gate resistor.

12. The gate drive circuit of claim 10, wherein the active gate control circuit is further configured to monitor the current being supplied to the gate drive circuit, and compare the monitored current to a current threshold.

13. The gate drive circuit of claim 12, wherein the active gate control circuit is configured to apply the second gating voltage to the gate of the switching element based at least in part on the comparison of the monitored current to the current threshold.

14. A bridge circuit used in a power converter of a power system, the bridge circuit comprising:
a first transistor having a gate, wherein the first transistor has a first current conduction capability and said first transistor being used to convert a first AC power signal provided from a rotor bus into a DC power suitable for a DC link or used to convert the DC power on the DC link to a second AC power signal provided to a line side bus;
a second transistor coupled in series with the first transistor, wherein the second transistor has a second current conduction capability and said second transistor being used to convert the first AC power signal provided from a rotor bus into the DC power suitable for the DC link or used to convert the DC power on the DC link to the second AC power signal provided to a line side bus;
a diode coupled in parallel with the first transistor;
a gate drive circuit configured to apply a voltage to the gate of the first transistor, the gate drive circuit comprising a gate resistor and an active gate control circuit;
wherein the active gate control circuit is configured to:
apply a first gating voltage via the gate resistor to the gate of the transistor to turn on the first transistor, the first gating voltage being greater than a threshold voltage for the first transistor;
detect a ride through grid event associated with an electrical grid coupled to the power system, wherein said grid event causes an increase in a current provided to the power converter;
responsive to detecting the grid event, apply a second gating voltage to the gate of at least one of the first transistor and the second transistor during the detected grid event such that at least one of the first current conduction capability and second current conduction capability is increased, the second gating voltage being greater than the first gating voltage.

15. The bridge circuit of claim 14, wherein the active gate control circuit is further configured to monitor a current being supplied to the power converter, the active gate control circuit being further configured to compare the monitored current to a current threshold.

16. The bridge circuit of claim 15, wherein the active gate control circuit is configured to apply the second gating voltage to the gate of at least one of the first transistor and the second transistor based at least in part on the comparison of the monitored current to the current threshold.

17. The bridge circuit of claim 14, wherein the first transistor is an insulated-gate bipolar transistor, including a collector and a gate or a silicon carbide metal-oxide-semiconductor field-effect transistor.

18. The bridge circuit of claim 17, where in the first transistor is an insulated-gate bipolar transistor, the bridge circuit further comprising a passive feedback element coupled between the collector and the gate of the first transistor.

* * * * *